US005847408A

United States Patent [19]

Kanemaru et al.

[11] Patent Number: 5,847,408

[45] Date of Patent: Dec. 8, 1998

[54] FIELD EMISSION DEVICE

[75] Inventors: Seigo Kanemaru; Junji Itoh, both of Tsukuba, Japan

[73] Assignee: Agency of Industrial Science & Technology, Ministry of International Trade & Industry, Tokyo, Japan

[21] Appl. No.: 824,016

[22] Filed: Mar. 21, 1997

[30] Foreign Application Priority Data

| | | | |
|---|---|---|---|
| Mar. 25, 1996 | [JP] | Japan | 8-067629 |
| Mar. 25, 1996 | [JP] | Japan | 8-067630 |

[51] Int. Cl.[6] .......... H01L 29/06

[52] U.S. Cl. .......... 257/10; 313/310; 313/336

[58] Field of Search .......... 257/10; 313/169, 313/336, 310; 315/349

[56] References Cited

U.S. PATENT DOCUMENTS

| | | | |
|---|---|---|---|
| 5,162,704 | 11/1992 | Korobi et al. | 315/349 |
| 5,455,196 | 10/1995 | Frazier | 437/187 |
| 5,548,181 | 8/1996 | Jones | 313/309 |

*Primary Examiner*—Olik Chaudhuri
*Assistant Examiner*—Douglas A. Wille
*Attorney, Agent, or Firm*—Oblon, Spivak, McClelland, Maier & Neustadt, P.C.

[57] ABSTRACT

A field emission device of simple structure enables stabilization and control of field emission current. Emission current is controlled by a plurality of control voltage systems. An emitter having a sharp tip is fabricated by processing a p-type semiconductor substrate, and an n-type source region is provided on the p-type semiconductor substrate surface at a position that is laterally separated from the emitter. An electrode layer having an aperture facing the apex portion of the emitter is provided on an insulating layer, the electrode layer extending to above the n-type source region. Voltage applied to the electrode layer to apply an extractor field to the apex portion of the emitter and to induce inversion layers at the emitter surface and the surface of the p-type semiconductor substrate. The electrode layer is divided into a plurality of electrodes. An extraction voltage is applied to one of these electrodes closest to the emitter, another electrode is connected to an X selection line and another to a Y selection line, thereby controlling emission current.

14 Claims, 6 Drawing Sheets

FIELD EMISSION DEVICE

BACKGROUND OF THE INVENTION

1. Field of the Invention

This invention relates to a field emission device particularly suitable for use as an electron source or electron gun in various types of electron beam utilizing equipment such as flat panel display (FPD) type image display devices, optical printers and electron beam exposure devices as well as in unsophisticated applications such as lamps and other such ultra-small light sources.

2. Description of the Prior Art

In a cathode ray tube or the like, thermoelectron emission is achieved by supplying the tube cathode with a large amount of heat energy. In contrast to this, the field emission device, a focus of intense research in recent years, achieves cold electron emission from the surface of a conductive material such as metal or semiconductor by applying a strong electric field of $10^6$–$10^7$ V/cm to the surface of the material. Wide utilization of this type of device would eliminate the need for CRTs and other devices that consume very large amounts of electric power. Since the device can be fabricated to very small dimensions, moreover, the circuit devices utilizing it would also enjoy greatly reduced power consumption, markedly smaller (thinner) case size, and lower weight.

FIG. 1 shows a typical structure adopted in a prior-art field emission device. The field emission device shown in FIG. 1 has a base member 11 serving as a physical support member for the field emission device as a whole, a conical (typically circular conical) emitter 13, generally several micrometers high, formed on the base member 11, and an extractor electrode 14 (also called a gate electrode) supported above the base member 11 by an insulating layer 12. The extractor electrode 14 is an electrode layer formed of conductive material and is used to apply extraction potential for promoting field emission. The extractor electrode 14 has an aperture 15 several micrometers in diameter and the distal end of the emitter 13, namely the apex portion $P_0$ in the case of an emitter 13 of circular conical shape, faces into the aperture 15.

When a voltage of not less than a prescribed value (generally called gate voltage Vg but here is called extraction voltage Vg to avoid confusion with the gate voltage in the field effect transistor, described hereinbelow) is applied to the extractor electrode 14, an electric field of sufficient strength to extract electrons from the emitter 13 is produced between aperture 15 edge and emitter 13 tip $P_0$. If the conical tip $P_0$ of the emitter 13 is processed to a sharp point so that its apex is substantially a point, the electric field produced by the extraction voltage Vg applied between the emitter 13 and the extractor electrode 14 efficiently concentrates at the pointed tip $P_0$. As a result, the desired field emission can be generated even at a relatively low applied voltage.

This has recently led to attempts to constitute the emitter 13 of semiconductor. For example, K. Betsui reports in Technical Digest 4th Int. Vacuum Microelectronics Conference, Nagahama, 1991, p.26 (Reference 1) that conical emitters having a sharp apex portion $P_0$ with a radius of curvature in the order of 5 nm were successfully obtained by applying sharpening technology combining plasma etching and thermal oxidation to a base member 11 of p-type or n-type single crystal silicon. Since the emitters produced large emission current at relatively low voltages and could be fabricated with high structural reproducibility, this is also expected to become a mainstream emitter fabrication method of the future. This fabrication method can also be applied to the present invention.

However, this type of field emission device has a drawback. This is that the field emission current fluctuates markedly, sometimes diminishing and sometimes rising several times in value. In fact, the field emission current may become so great that the field emission device is destroyed. The main cause of the fluctuation is thought to be large spatial and temporal variation in the work function of the emitter tip owing to absorption of residual gas in the operating environment and/or contamination etc. during the fabrication process.

To overcome this problem, it is necessary either to completely stabilize the work function of the emitter tip or to actively control the emission current. Although the former method is quite difficult to implement, interesting proposals regarding the latter method were recently published by A. Ting et al. in Technical Digest 4th Int. Vacuum Microelectronics Conference, Nagahama, 1991, p.200 (Reference 2) and by K. Yokoo et al. in Technical Digest 7th Int. Vacuum Microelectronics Conference, Grenoble, France, 1994, P.58 (Reference 3).

The method will be explained with reference to FIGS. 2(A) and 2(B), in which components corresponding to those in FIG. 1 are assigned the same reference symbols as those in FIG. 1. As shown in FIG. 2(B), the method attempts to control the emission current from the emitter 13 by controlling the drain current of a field effect transistor (FET) connected in series with the field emission device. The drain current of the FET is fundamentally controlled by the gate voltage of the FET (the FET gate voltage is designated as Vc in this specification to distinguish it from the extraction voltage Vg applied to the extractor electrode 14 of the field emission device). From this it follows that the emission current from the emitter 13 of the field emission device can be fundamentally controlled and stabilized by the gate voltage Vc applied to the FET.

However, a satisfactory device structure for implementing this principle is not yet available. Consider, for example, the configuration shown in FIG. 2(A), which was reported in connection with the foregoing method. Here, the base member 11 is constituted of p-type semiconductor and an n-type source region 21 and an n-type drain region 22 spaced apart from each other are formed on the surface portion of the base member 11 to define the surface substrate region between them as a channel region in which an inversion layer 26 is selectively formed. A gate insulating layer 24 is formed on the channel region 23 and the control electrode 25 of the FET is formed on the gate insulating layer 24. While this is substantially the basic structure of an ordinary MOSFET, innovation can be noted at the position where the emitter 13 of the field emission device is provided. Specifically, the emitter 13 is built on the surface of the drain region 22 and the extractor electrode 14 of the field emission device is formed on a continuation thereof via the insulating layer 12 also serving as a field insulating layer, whereby the FET and the field emission device are integrated laterally into a unitary device, so to speak.

Therefore, after the source region 21 has been set at ground potential E, for example, and the extraction voltage Vg for extracting electrons has been applied to the extractor electrode 14 of the field emission device, if the gate voltage Vc is applied to the FET control electrode 25 at a level matched to the magnitude of the required field emission current, then the magnitude of the electron current emitted into space from the emitter 13 of the field emission device will be controlled to the desired value. The reference numerals 21, 22 and 25 in FIG. 2(B) correspond to the same regions as the regions of the device structure designated by the same reference numerals in FIG. 2(A).

From the operating principle and equivalent circuit shown in FIG. 2(B), it is clear that the emission current can be actively controlled with high precision. Generally, however, a large number of field emission devices of this type have to be densely integrated on a single base member 11. From this point of view, the circuit principle illustrated in FIG. 2(B), which is valid in itself, should preferably not be implemented by adopting the device circuitry of FIG. 2(A). The area required for forming the FET is proportional to the area required for forming the emitter 13 and generally becomes fairly large. The result is a field emission device of quite low packing density and large spacing between adjacent devices. Since the emitter 13 is built completely separately from the FET having a specialized gate insulating layer 24, moreover, the fabrication process becomes highly complex, with a resultant decrease in yield.

In Japanese Patent Application No. HEI-7-217107 filed on Aug. 25, 1995, the present inventors disclosed an improved version of the prior-art device shown in FIG. 2. A cross-sectional view of the improved version is shown in FIG. 3, in which elements that are the same as elements in FIGS. 1 and 2 are given the same reference numerals. With reference to the device shown in FIG. 3, the base member is limited to a p-type semiconductor substrate 31 on a principle surface of which are formed a p-type source region 32 and an n-type drain region 35 that are separated laterally to define the p-type region between them as a channel region constituting an inversion layer 36. A source electrode 33 is provided on the surface of the n-type source region 32, and an emitter 13 is provided on the surface of the n-type drain region 35, either integrated with the n-type drain region 35 or as a member that is separate from the n-type drain region 35. In either case, via the n-type drain region 35 the emitter 13 is connected with the inversion layer 36 formed on the p-type semiconductor substrate 31. To selectively induce an inversion layer 36 at the surface of the p-type semiconductor substrate 31, it is necessary to have a control electrode to apply a voltage to generate the required electric field. However, in the case of the illustrated device this function is also performed by the extractor electrode 34 used to extract electrons from the emitter 13. Namely, the extractor electrode 34, which is formed with an aperture 15 around the apex portion $P_0$ of the emitter 13, is provided extending laterally on the insulating layer 12 above the n-type source region 32 and n-type drain region 35.

Therefore, in addition to its original action as the field emission device extraction voltage Vg, the voltage applied to the extractor electrode (control electrode) 34 also functions as a control voltage Vc in the FET structure. In this case, the flow of field emission current from the emitter 13 increases exponentially with increasing magnitude of the applied voltage Vg (Vc). However, since the channel current flowing through the inversion layer 36 increases more or less by the square, setting the applied voltage Vg (Vc) at a relatively high value enables the field emission current to be controlled to be larger than the channel current. In other words, by using the channel current to limit the field emission current, emission of a constant current from the emitter apex portion $P_0$ can be obtained in the same way as in the prior-art example described with reference to FIG. 2.

Of the above prior-art devices, cold electron emission devices based on the structural principle illustrated by FIG. 3 are the most superior. Unlike in the prior-art arrangement of FIG. 2, a control electrode in the case of a FET or an extraction electrode in the case of a field emission device do not have to be separately fabricated or separate insulating layers 24 and 12 but can be fabricated in a single process on the same insulating layer 12. Thus, it is structurally the most straightforward and also has a satisfactory emission current stabilization function.

However, there is still room for improvement. There is still the constraint that the emitter 13 has to be provided on an n-type drain region 35 provided on the surface of a p-type semiconductor substrate 31, which is not very desirable. Specifically, the addition of the process for fabricating the n-type drain region 35 increases the field emission device fabrication cost and time, and it also lowers the yield, and even when it does not, it tends to cause a decrease in the field emission current. Above all, it imposes constraints on the material, properties and conduction type of the emitter 13.

Moreover, the FET channel current and field emission current cannot be independently controlled and the only way to implement the condition of the emission current exceeding the channel current is to increase the electrode voltage. As a result, either the control function does not become operational unless the voltage is in a relatively high region, or fine or flexible control of the field emission current is not possible.

This invention was accomplished to overcome the foregoing problems and has as an object, first, to propose a field emission device which, while controlling field emission current from the emitter 13 of a FET according to the principle illustrated in FIG. 2(B), is of a structure essentially avoiding a major increase in size and decrease in packing density per unit field emission device, and second, to provide a field emission device that can realize various control states using multiple system voltage signals.

SUMMARY OF THE INVENTION

For achieving the first object, the present invention provides a field emission device comprising an n-type source region having an attached source electrode formed on a surface of a p-type semiconductor substrate, an emitter rising from a surface of the p-type semiconductor substrate with which the emitter is in direct contact, the emitter being laterally separated from the n-type source region and having a sharply pointed apex portion; and an extraction and control electrode formed by an electrode layer provided on an insulating layer formed on the p-type semiconductor substrate having an aperture facing the apex portion of the emitter, said electrode layer extending from the portion in which the aperture is formed to above the n-type source region for extracting cold electrons from the emitter and for applying a voltage for selectively inducing an inversion layer on a surface of the p-type semiconductor substrate between the n-type source region and the emitter and on the emitter surface.

The emitter may be formed by processing the p-type semiconductor substrate itself or may be formed directly on the p-type semiconductor substrate. It is also preferable to have the emitter surface covered by a chemically inert protective layer, such as a thin layer of carbon or silicon carbide.

For achieving the second object, the present invention provides a field emission device comprising a p-type semiconductor substrate on a surface of which are formed an n-type source region having an attached source electrode, an emitter rising from a surface of the p-type semiconductor substrate, the emitter being laterally separated from the n-type source region and having a sharply pointed apex portion, an insulating layer provided on the p-type semiconductor substrate between the emitter and the n-type source region, an extractor electrode provided on the insulating layer for extracting cold electrons from the apex portion of the emitter, the extractor electrode having an aperture that faces the emitter apex portion, and a plurality of control electrodes provided on the insulating layer between an edge of the source region side of the extractor electrode and an edge of the source region on the emitter side for selectively applying a voltage to induce an inversion layer at the p-type semiconductor substrate surface below the insulating layer, the control electrodes being arranged laterally in a mutually parallel relationship.

Assuming there are two control electrodes, the electrodes could be used with one connected to an X selection line and the other connected to a Y selection line perpendicular to the X line. If there are three control electrodes, one could be connected to an X selection line, one of the others could be connected to a Y selection line perpendicular to the X line, and the third could be connected to a control line that controls the field emission current via the emitter. It is also preferable to provide a substrate potential source for applying a desired substrate potential to the p-type semiconductor substrate.

DESCRIPTION OF THE PREFERRED EMBODIMENTS

Figure 1:
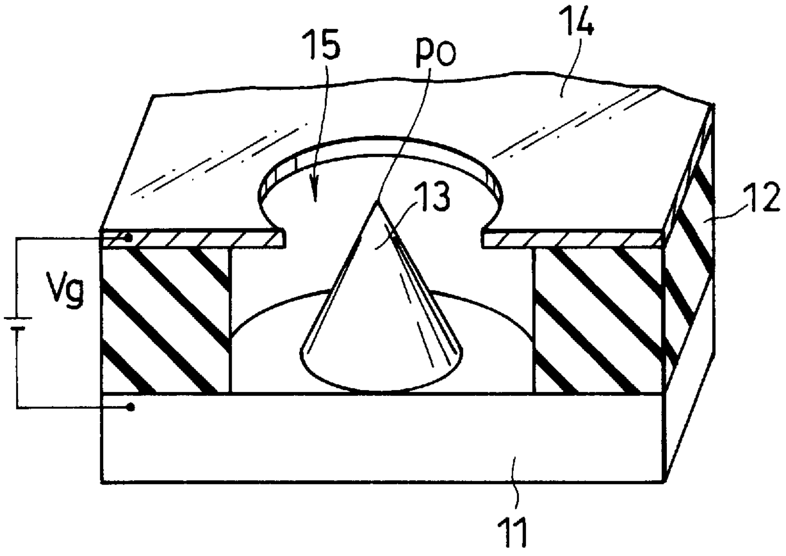
FIG.1 (PRIOR ART)
FIG. 1 is a perspective cross-sectional schematic view showing the basic structure of a prior-art field emission device.
Figure 2A:
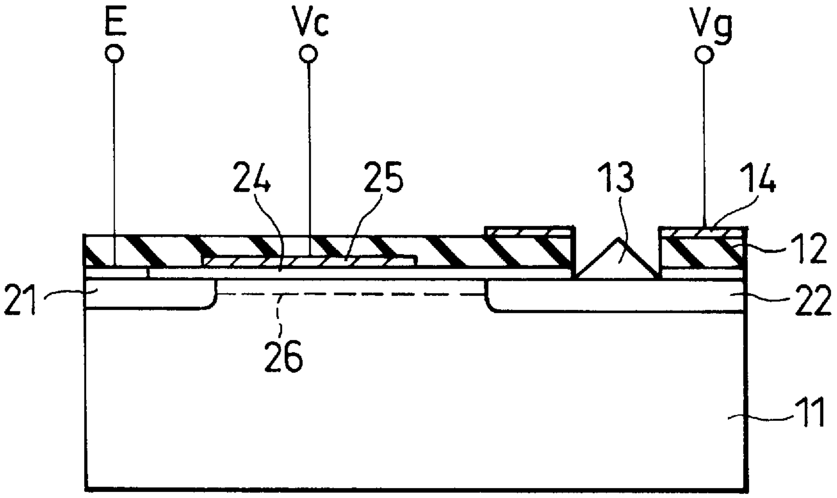
FIG.2(A) (PRIOR ART)
FIG. 2(A) is a schematic view showing a prior-art field emission device structure for stabilizing field emission current.
Figure 2B:
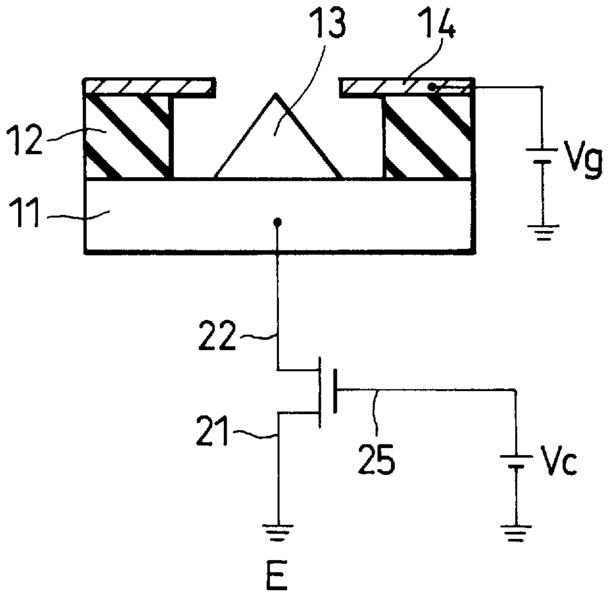
FIG.2(B) (PRIOR ART)
FIG. 2(B) is a diagram for explaining the operating principle of the device of FIG. 2(A).
Figure 3:
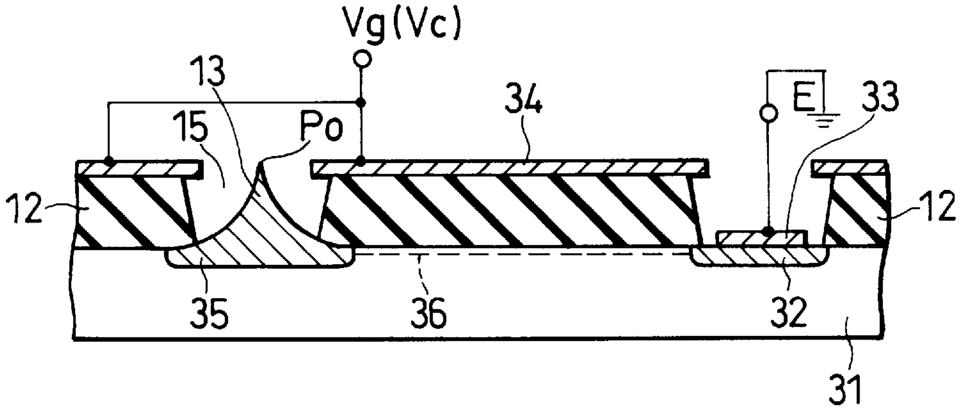
FIG.3 (PRIOR ART)
FIG. 3 is a schematic view showing the structure of an improved version of the prior-art field emission device of FIG. 2(A).
Figure 4:
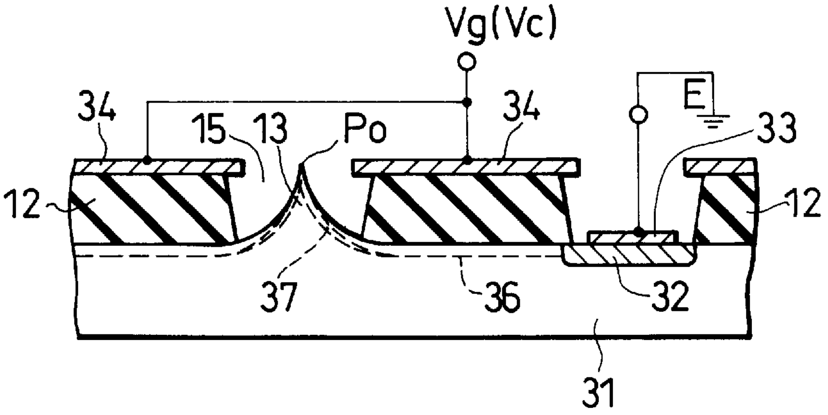
FIG. 4 is a schematic diagram showing the structure of a field emission device that is a preferred embodiment of the invention.

FIG. 4 schematically illustrates the essential structural elements of a field emission device according to this invention. As pointed out earlier, this type of field emission device is ordinarily required to be fabricated in large numbers at high packing density. Since this invention is applicable to such devices as individual units, however, the embodiments that follow are each described and illustrated in terms of a unit element. In addition, structural elements which correspond to or can be the same as those of the prior-art field emission device explained in the foregoing with reference to FIGS. 1 to 3 are assigned the same reference symbols.

The invention field emission device shown in FIG. 4 comprises a p-type semiconductor substrate 31. The p-type semiconductor substrate 31 serves as a physical support member for the device. A known method is used to process the p-type semiconductor substrate 31 itself to form an emitter 13 having a sharp apex portion $P_0$. In accordance with the structural gist of the invention, the emitter 13 has to be provided in direct contact with the surface of the p-type semiconductor substrate 31, from which the emitter 13 rises. In the embodiment illustrated in FIG. 4, the emitter 13 is obtained by processing the p-type semiconductor substrate 31 itself, which clearly meets the requirement.

An insulating layer 12 is formed on the p-type semiconductor substrate 31 and an extractor electrode for extracting electrons from the emitter 13, as described below, and an electrode layer 34 which also serves as a control electrode for inducing an inversion layer in the FET portion, are formed on the insulating layer 12. Specifically, the electrode layer 34 is formed with an aperture 15, a recess is formed under the aperture 15, and an emitter 13 is provided in the recess. In this embodiment, the emitter 13 is a three-dimensional structure in the shape of a cone, and is positioned with the tip $P_0$ of the cone facing into the aperture 15 of the electrode layer 34.

An n-type source region 32 is provided on the surface of the p-type semiconductor substrate 31 at a position that is laterally separated from the emitter 13, and a source electrode 33 is formed on the surface of the n-type source region 32. The source electrode 33 is connected to an external circuit, in this case to ground E. In actual fact, the n-type source region 32 can be formed after the electrode layer 34 with the aperture 15 is formed on the insulating layer 12 and lithography or other such means is used to form an opening to expose the surface of the p-type semiconductor substrate 31 where the n-type source region 32 is to be formed, following which the n-type source region 32 can be formed by using a method such as ion implantation to introduce n-type impurity to a suitable depth. Specifically, with reference to the process used to fabricate the prior-art field emission device described with reference to FIG. 1, the increase in the process steps required to fabricate the n-type source region 32 is minimal, and the risk of damage to the emitter 13 can be kept to a minimum. Forming the source electrode 33 is simple.

When this fabrication procedure is followed, the part of the electrode layer 34 that remains between the emitter 13 and the n-type source region 32, namely the electrode layer portion extending from the portion with the aperture 15 facing the apex portion $P_0$ of the emitter 13 to above the n-type source region 32, forms an electrode via which an inversion layer 36 can be selectively induced at the surface of the p-type semiconductor substrate 31 below the insulating layer 12 by the application of voltage Vc. Thus, the electrode layer 34 can perform the basic function corresponding to that of a control electrode provided on the channel formation region of a FET structure. As a result, the inventive device is capable of the following type of operation.

When the emitter 13 is formed of a p-type semiconductor and a suitable extraction voltage Vg (which also comprises control voltage Vc) is applied to the electrode 34 which is an extractor electrode for extracting cold electrodes and a control electrode for selectively inducing an inversion layer 36 at the surface of the p-type semiconductor substrate 31, an inversion layer 36 is formed on the surface of the emitter 13 near the aperture 15, from the apex portion $P_0$ to slightly below. An inversion layer 36 is also formed on the portion of the surface of the p-type semiconductor substrate 31 between the emitter 13 and the n-type source region 32. In the illustrated case the presence of a depletion layer 37 is also considered, as described below. Even when that is not the case, electrons transported from the source region 32 can reach the apex portion $P_0$ via the emitter surface and be extracted by a strong electrical field provided there is a connection between the inversion layer 36 on the emitter apex portion $P_0$ side and the inversion layer 36 formed on the surface of the p-type semiconductor substrate 31 below the electrode layer 34 in the vicinity of the emitter. This state can also arise depending on the dimensional relationship of the various parts and the magnitude of the voltage applied to the electrode 34, and, as described in the foregoing, a field emission device is accordingly implemented having a current stabilization function provided by the addition of a series FET structure. That is, the flow of field emission current produced by the emission of electrons from the emitter 13 increases exponentially with the increasing magnitude of the applied voltage Vg (Vc). However, since the channel current flowing through the inversion layer 36 increases more or less by the square, setting the applied voltage Vg (Vc) at a relatively high value enables the field emission current to be controlled to be larger than the channel current. By therefore using the channel current to limit the field emission current, controlled emission of a constant current from the emitter apex portion $P_0$ can be obtained.

As shown in FIG. 4, inversion layer 36 is formed in the region of the apex portion $P_0$ of the emitter 13 when a prescribed voltage Vg (Vc) is applied to the (extractor electrode/control electrode 34, and the depletion layer 37 expands near the base portion (the portion in contact with the surface of the p-type semiconductor substrate 31). Even in this case, however, the field emission device functions without problem. That is because electrons transported within the surface inversion layer 36 of the p-type semiconductor substrate from the n-type source region 32 toward the base portion of the emitter can drift in the depletion layer 37 portion of the emitter 13 to the inversion layer 36 on the apex portion $P_0$ side. Conversely, this makes it possible to fully determine the dimensional relationships of the various parts and the magnitude of the applied voltage, which age design-related items. Even if it is assumed that an inversion layer does not form on the surface of the emitter 13 for some reason or another, such as the higher surface state of the emitter apex portion $P_0$, if there is a general depletion of the emitter 13 the electrons transported by the surface inversion layer 36 of the p-type semiconductor substrate 31 will drift in the emitter depletion layer to the apex portion $P_0$, enabling extraction to be effected by a strong electrical field and the device to operate without a problem.

This finding led the present inventors to the conclusion that the emitter 13 may be of the same conduction type as the p-type semiconductor substrate 31. The technical concept of the invention means that a field emission device can be provided that enables good, existing processing methods to be used to fabricate the emitter 13 from the p-type semiconductor substrate 31, minimizes any increase in fabrication process steps, and alleviates the drawbacks of the prior-art device shown in FIG. 3 while at the same time incorporating an emission current stabilization function.

Figure 5:
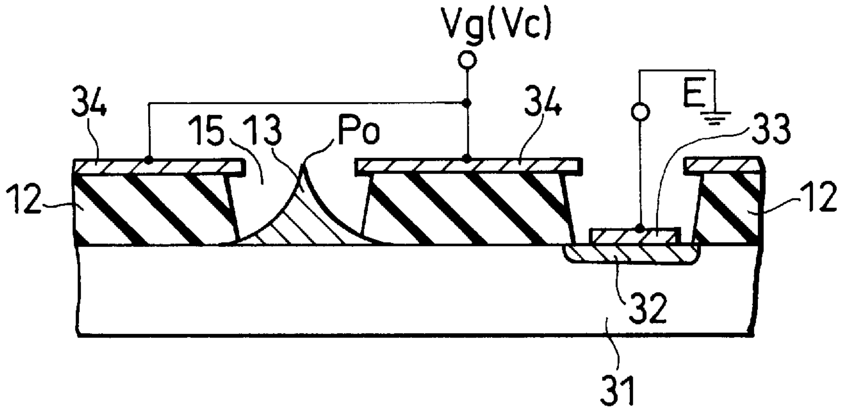
FIG. 5 is a schematic diagram showing the structure of a modified version of a field emission device according to the invention.

In other words, the emitter 13 can be provided directly on the p-type semiconductor substrate 31 without the need for the n-type drain region 35 used in the prior-art example shown in FIG. 3. Thus, the emitter 13 can be fabricated in a suitable metallic material or n-type semiconductor material in direct contact with the p-type semiconductor substrate 31, as in another embodiment of the invention shown in FIG. 5. Other structural elements may be the same as those in the field emission device shown in FIG. 4, so further description thereof is omitted. The emission of the field emission device having the current stabilizing function also operates according to the same principle. This embodiment has the advantage of high flexibility, in that other than the emitter 13 being formed by a method such as the vacuum deposition method, there are virtually no constraints on the fabrication process or material used.

Figure 6:
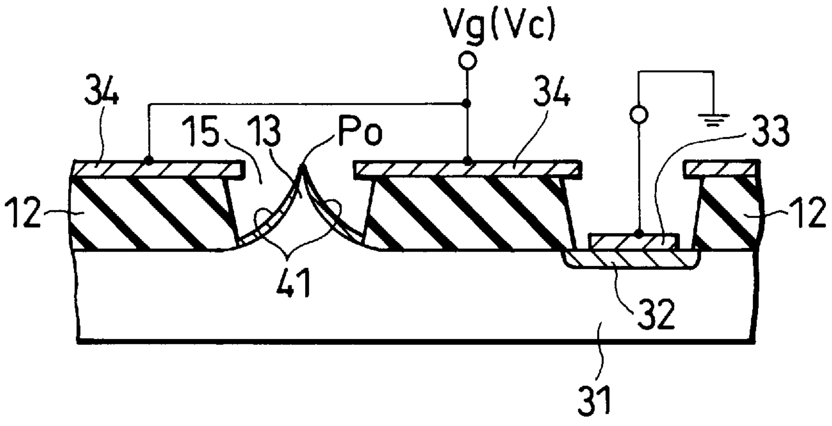
FIG. 6 is a schematic view showing the structure of a field emission device that is another embodiment of the invention.

FIG. 6 shows another preferred embodiment of the present invention, which will be described with reference just to the differences between this embodiment and the embodiment shown in FIG. 4. Namely, the emitter 13 is covered by a protective layer 41 of a chemically stable material such as carbon or silicon carbide, for example. Since the surface of the emitter 13 is thereby rendered chemically inactive residual gas molecules in the vacuum do not readily adhere to the emitter surface. This is desirable, since it allows decrease of emission current to be suppressed, even in low vacuum conditions.

Figure 7A:
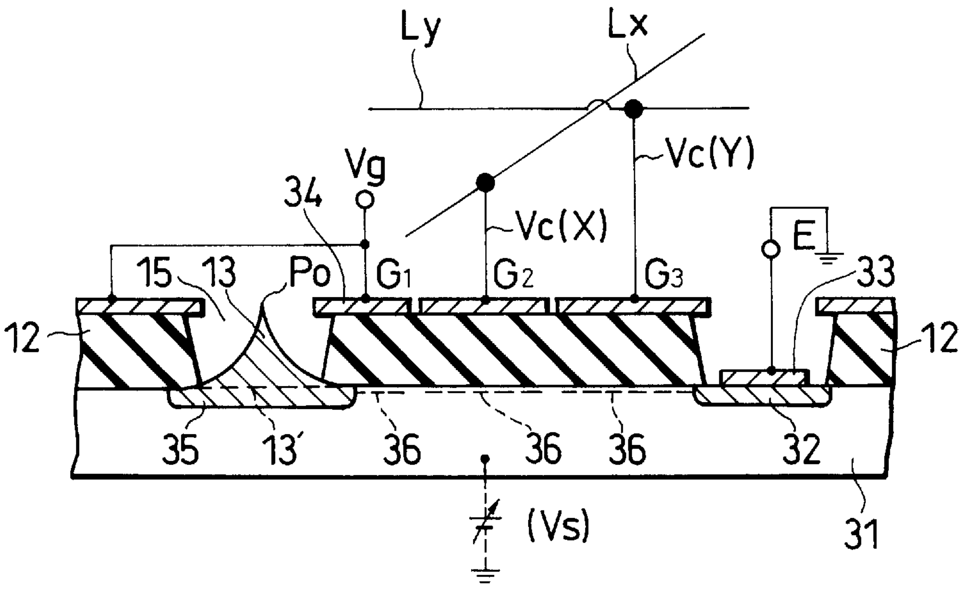
FIGS. 7(A) and 7(B) are schematic views showing the structure of a field emission device that is another preferred embodiment of the invention.
Figure 7B:
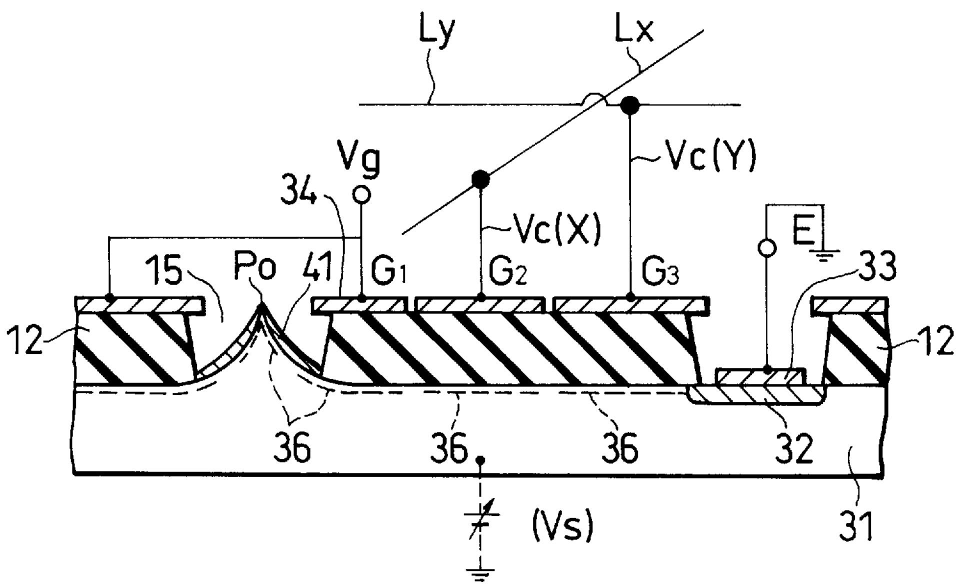

FIGS. 7(A) and 7(B) are schematic cross-sectional structural views showing the principal elements of a field emission device that is another preferred embodiment of the invention. A FPD incorporates multiple field emission devices densely arrayed in a matrix comprised of X and Y lines disposed in a mutually perpendicular arrangement. Since this invention is applicable to such devices as individual units, however, the embodiments that follow are each described and illustrated in terms of a unit element.

The invention field emission device shown in FIG. 7(A) comprises a p-type semiconductor substrate 31. The p-type semiconductor substrate 31 serves as a physical support member for the device. In addition, a preferred known method, described with reference to FIG. 1, is used to process the p-type semiconductor substrate 31 itself to form an emitter 13 having a sharp apex portion $P_0$. This emitter 13 is formed as an n-type by the introduction of n-type impurity by ion implantation or the like at the same time n-type source region 32 is formed, as described below. In this embodiment ion implantation is also used to form an n-type drain region 35 at the surface portion of the p-type semiconductor substrate 31 that constitutes the base portion of the emitter. This type of processing method is also used in the prior-art example described with reference to FIG. 3.

An insulating layer 12 is formed on the p-type semiconductor substrate 31. On the insulating layer 12 are formed an extractor electrode $G_1$ for extracting electrons from the emitter 13, and a plurality of control electrodes $G_2$ and $G_3$, arranged in parallel, for selectively inducing an inversion layer in the FET structure portion. Of these, extractor electrode $G_1$, via which extraction voltage Vg is selectively applied, is formed with an aperture 15, a recess is formed under the aperture 15, and the emitter 13 having a three-dimensional structure in the shape of a cone is provided in the recess with the apex portion tip $P_0$ of the emitter 13 facing into the aperture 15. The extractor electrode $G_1$ therefore corresponds to the extractor electrode 14 in the prior-art devices shown in FIGS. 1 and 2.

The n-type source region 32 is provided on the surface of the p-type semiconductor substrate 31 at a position laterally separated from the emitter 13. The source electrode 33 formed on this surface is connected to an outside circuit, in this case to a ground E. The n-type source region 32 can be formed after the electrode layer 34 with the aperture 15 is formed in a single sequence on the insulating layer 12 after the electrode layer 34 is divided into the electrodes $G_1$, $G_2$ and $G_3$ in a single process step, and lithography or other such means is used to form an opening of a prescribed size at a prescribed position in the control electrode $G_3$ that is furthest from the emitter 13, exposing the surface of the p-type semiconductor substrate 31, following which the n-type source region 32 is formed by using a method such as ion implantation to introduce n-type impurity to a suitable depth. Relative to the process used to fabricate the prior-art field emission device described with reference to FIG. 1, the increase in the process steps required to fabricate the n-type source region 32 is minimal, and the risk of damage to the emitter 13 can be kept to a minimum. Forming the source electrode 33 is simple. Compared also to the method used to fabricate the field emission device of FIG. 3 which is an improved version of the prior-art devices shown in FIGS. 1 and 2, the only additional process required by the present invention is the simple step of dividing the electrode layer 34 into plural electrodes $G_1$, $G_2$ and $G_3$. This also applies with respect to other embodiments described below, in which dividing the control electrode into four or more, up to an arbitrary N electrodes, means simply an increase in the number of dividing lines, and not an increase in the number of process steps. Moreover, when the emitter 13 and drain region 35 are formed as an n-type emitter and drain region at the same time n-type source region 32 is formed by ion implantation of n-type impurity, the electrode layer 34 formed with the aperture 15 and source region formation aperture constitutes a mask. The process therefore becomes a type of self-alignment process that does not require the use of ion implantation masks.

In accordance with this structure, when control voltages Vc(X) and Vc(Y) of significant magnitude are applied to control electrodes $G_2$ and $G_3$ while extraction voltage Vg is being applied to extractor electrode $G_1$, inversion layers 36 are formed at the surface of the p-type semiconductor substrate beneath the respective control electrodes $G_2$ and $G_3$, and an electrically connective state can be established between the source region 32 and the drain region 35 and emitter 13. Since the field emission current actually emitted at this time via the emitter 13 is limited by a channel current corresponding to the magnitude of control voltages Vc(X) and Vc(Y), the result is that it is controlled very stably. Furthermore, even if an extraction voltage Vg in the order of 70 V, for example, is applied to the extractor electrode $G_1$, channel current can be controlled by applying a control voltage Vc(X) and Vc(Y) to the control electrodes $G_2$ and $G_3$ that at the highest is around 5 V to 10 V. Put another way, the strength of the electrical field applied to the apex portion $P_0$ of the emitter 13 can be arbitrarily controlled by independently controlling the extraction voltage Vg applied to the extractor electrode $G_1$. In this case, since the channel current supplied to the emitter 13 via the n-type drain region 35 can also be controlled independently of the control voltage Vc(X) or Vc(Y), or both, applied to the control electrodes $G_2$ and $G_3$, the controllability and degree of control freedom are far higher than those of the prior-art device shown in FIG. 3.

From the above, based on the principle involved, by taking the control voltages Vc(X) and Vc(Y) as control signals in a voltage dimension, these multiple system voltage values Vc(X) and Vc(Y) can be used to control or limit the amount of field emission current via the emitter 13 to a certain prescribed value by independently varying each of the voltage values, or fixing one at a given value to control the maximum channel current and varying just the other voltage value. A typical example of an application using dual system voltage signals such as voltage signals Vc(X) and Vc(Y) is that of a FPD, as described above, in which the signals are used to selectively drive any of a plurality of invention field emission devices integrated into an XY matrix. Specifically, as illustrated in the drawing, one of the two control electrodes $G_2$ and $G_3$, for example $G_2$, could be connected to one line Lx of a plurality of X selection lines, and another control electrode, for example $G_3$, could be connected to one line Ly of a plurality of Y selection lines, so that the illustrated field emission device turns on only when both Lx and Ly are subjected to respective control voltages Vc(X) and Vc(Y) that are above a prescribed significant value, and field emission from the emitter 13 only takes place when the emission current has stabilized. The significant voltage value selected will be of a magnitude whereby there is an adequate flow of a sufficient large channel current in the surface portions of the p-type semiconductor substrate 31 below the control Electrodes $G_2$ and $G_3$, via the insulating layer 12.

A depletion layer forms at the surface of the p-type semiconductor substrate 31 below the insulating layer 12, between the extractor electrode $G_1$ and the adjacent control electrode $G_2$, and between adjacent control electrodes $G_2$ and $G_3$. While the width of the depletion layer is determined by the concentration of impurity in the p-type semiconductor substrate 31, the thickness of the insulating layer 12 and the magnitude of the voltage applied to the electrodes that apply the voltage to form the inversion layer 36, the distance between the electrodes can be set so that electrons in the inversion layer 36 moving toward the emitter 13 side can move to an adjacent inversion layer 36. This is a simple design matter. When the voltage applied to the control electrodes on each side of the depletion layer is the same, for example, the distance between the electrodes should be not more than twice the width of the depletion layer formed around the inversion layer 36 on one side. This could be achieved by positioning edges of adjacent inversion layers with the horizontal range of carriers (electrons), which concept can be applied in other embodiments of the invention described below.

With respect also to the emitter 13, the emitter 13 may be constituted of n-type semiconductor or a metallic material independently of the p-type semiconductor substrate 31 formed on the surface of the n-type drain region 35, and the drain region 35 may even be omitted and the emitter 13 provided directly on the surface of the p-type semiconductor substrate, as shown by the broken line 13' in FIG. 7(A). It is in fact undesirable to have the constraint of having to provide the emitter 13 on an n-type drain region 35 formed on the surface of the p-type semiconductor substrate 31. That is to say, it also gives rise to constraints on the material, properties and conductivity type of the emitter 13. In contrast, the ability to provide the emitter 13 directly on the surface of the p-type semiconductor substrate 31 has the advantage of high flexibility, in that other than the emitter 13 being formed by a method such as the vacuum deposition method, there are virtually no constraints on the fabrication process or material used. Even when the emitter 13 is provided directly on the surface of the p-type semiconductor substrate 31, the emitter 13 can still be connected to inversion layers 36 below control electrodes via an inversion layer 36 selectively formed at the p-type semiconductor substrate 31 below the extractor electrode $G_1$. This also applies with respect to other embodiments of the invention described with reference to FIGS. 8 and 9.

In FIG. 7(A), a broken line is also used to indicate a variable potential substrate source for applying a substrate potential Vs to the p-type semiconductor substrate 31. The substrate potential is controlled so that, for example, increasing the forward potential raises the inversion layer 36 formation threshold voltage value and decreasing the potential lowers the threshold voltage value. In the case of the illustrated variable potential source, forward is toward the p-type semiconductor substrate 31, but in some cases a reverse substrate bias is also possible. As such, when a plurality of the field emission devices of the invention are integrated on a single substrate, the illustrated substrate potential source Vs can be used for overall control of field emission current via the emitters of all the devices to which control voltages Vc(X) and Vc(Y) of the same value are being applied, whether control voltages Vc(X) and Vc(Y) are being used to switch the channel current of specific devices on and off or are just being used to control the flow of channel current through on channels. When using a device such as a FPD in which the field emission devices of the invention are integrated, this means that the overall brightness of the screen can be adjusted, in which case substrate potential source Vs would become brightness control voltage Vs. The substrate potential source Vs is also shown in other embodiments of the invention and can be employed in the same way. This is particularly useful when applied in embodiments of the invention to enable control of gradation levels on a device by device basis in a FPD matrix, such as described with reference to FIG. 2.

Another embodiment of the invention is shown in FIG. 7(B), which description thereof is limited to those aspects that differ from those of the embodiment of the invention shown in FIG. 7(A); with respect to other parts, the explanation already given also applies to FIG. 7(B). What is different compared to the inventive field emission device shown in FIG. 7(A) is that the emitter 13 is a p-type emitter fabricated from the p-type semiconductor substrate 31 itself. The device operates with no problem while maintaining the current stabilizing function and selectable controllability effected by the plural control electrodes $G_2$ and $G_3$, as in the case of the device shown in FIG. 7(A).

Specifically, when the emitter 13 is p-type semiconductor and a suitable extraction voltage Vg is applied to the extractor electrode $G_1$ for extracting cold electrons, an inversion layer 36 is formed at the surface of the emitter 13 from the apex portion $P_0$ to a portion slightly below, near to the aperture 15. Inversion layers 36 are also formed at the base of the emitter 13 (the portion in contact with the surface of the p-type semiconductor substrate 31). Thus, there may be a depletion layer between the two inversion layers 36 However, if the inversion layer 36 on the emitter tip $P_0$ side is connected with the inversion layer 36 formed at the p-type semiconductor substrate surface below extractor electrode $G_1$ in the vicinity of the emitter, electrons transported from the n-type source region 32 can reach the tip $P_0$ via the surface of the emitter and be extracted by a powerful electrical field. It is also possible for this state to arise depending on the dimensional relationship of the various parts and the magnitude of the voltage applied to the extractor electrode $G_1$ and, as described in the foregoing, a field emission crevice is accordingly implemented having a current stabilization function provided by the addition of a series FET structure.

An inversion layer 36 is formed in the vicinity of the emitter 13 apex portion $P_0$ when a prescribed extraction voltage Vg is applied to the extractor electrode $G_1$, as shown in FIG. 7(B). In addition to this, there is an expansion of the depletion layer near the base portion. Even in this case, however, the field emission device functions without problem, because electrons transported within the surface inversion layer 36 of the p-type semiconductor substrate from the n-type source region 32 toward the base portion of the emitter drift in the depletion layer portion of the emitter 13 to the inversion layer 36 on the apex portion $P_0$ side. This makes it possible to fully determine the dimensional relationships of the various parts and the magnitude of the applied voltage, which are design-related items. Even if it is assumed that an inversion layer does not form on the surface of the emitter 13 for some reason or another, such as the higher surface state of the emitter apex portion $P_0$, if there is a general depletion of the emitter 13 the electrons transported by the surface inversion layer 36 of the p-type semiconductor substrate 31 will drift in the emitter depletion layer to the apex portion $P_0$, enabling extraction to be effected by a strong electrical field and the device to therefore operate without a problem.

As described, the emitter 13 is formed from the p-type semiconductor substrate itself, and a further major advantage is that after it is formed, it does not require a process step to effect n-type inversion but can be used in its p-type state without modification. Thus, a field emission device can be provided that enables good, existing processing methods to be used to fabricate the emitter 13 with a sharp tip on the apex portion $P_0$, minimizes any increase in fabrication process steps, and alleviates the drawbacks of the prior-art device shown in FIG. 3 and at the same time incorporates an emission current stabilization function.

In the device embodiment shown in FIG. 7(B), the emitter 13 is covered by a protective layer 41 of a chemically stable material such as carbon or silicon carbide, for example. Since the surface of the emitter 13 is thereby rendered chemically inactive residual gas molecules in the vacuum do not readily adhere to the emitter surface. This is desirable, since it allows decrease of emission current to be suppressed, even in low vacuum conditions. The protective layer 41 can also be employed in other embodiments of the invention described below.

Figure 8:
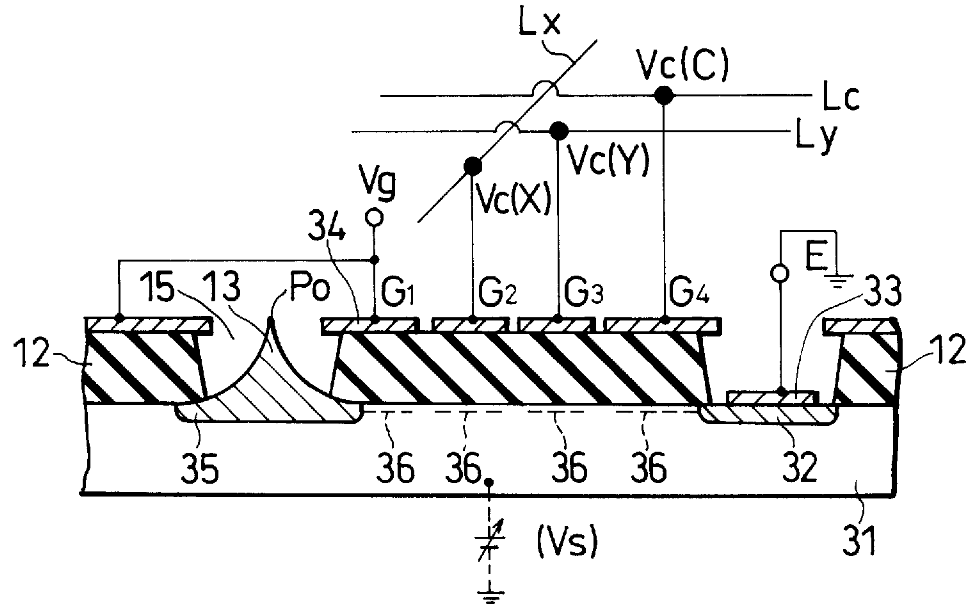
FIG. 8 is a schematic view showing the structure of another embodiment of the invention.

FIG. 8 is a diagram showing the arrangement of a field emission device that is another embodiment of the invention. Here, only the points of difference between this embodiment and the embodiments of FIGS. 7(A) and 7(B) will be described, since other aspects are identical and have therefore already been explained. In this embodiment, the electrode layer 34 formed on the insulating layer 12 is divided into multiple electrodes, four in the illustrated example. One of these is extractor electrode $G_1$ in which an aperture 15 is formed, and the other three constitute control electrodes $G_2$, $G_3$ and $G_4$. In this arrangement, two of the three control electrodes $G_2$, $G_3$ and $G_4$, for example $G_2$ and $G_3$, can be used as control electrodes to selectively drive any of a plurality of invention field emission devices integrated into an XY matrix for an FPD or the like, as described with reference to FIGS. 7(A) and 7(B), while the remaining electrode $G_4$ can be used to control the field emission current flow, that is, to control the gradation level of each pixel of the FPD screen. Specifically, as illustrated in the drawing, one of the two control electrodes $G_2$ and $G_3$, for example $G_2$, could be connected to one line Lx of a plurality of X selection lines, and another control electrode, for example $G_3$, could be connected to one line Ly of a plurality of Y selection lines, so that the illustrated field emission device turns on only when both Lx and Ly are subjected to respective control voltages Vc(X) and Vc(Y) that are above a prescribed significant value, and field emission from the emitter 13 only takes place when the emission current has stabilized. Electrode $G_4$ is connected to the illustrated one line Lc of a plurality of gradation control lines, and by applying a gradation control voltage Vc(C) thereto, the channel current can be changed steplessly or in fine steps.

Figure 9:
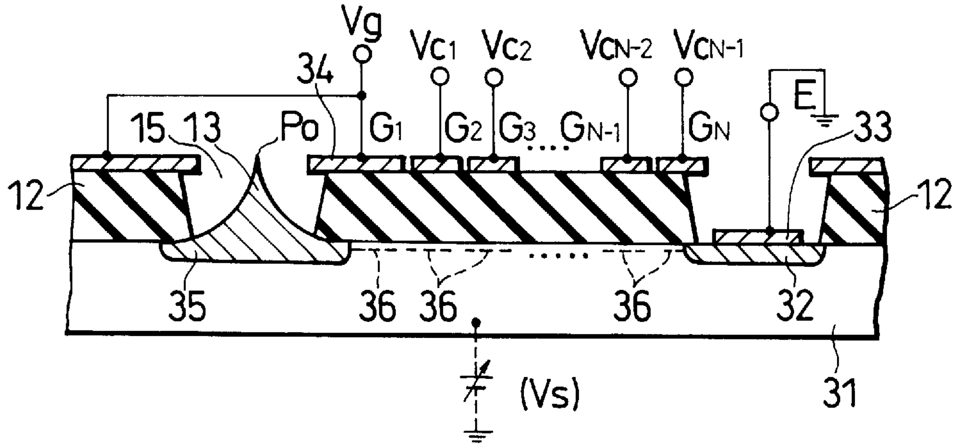
FIG. 9 is a schematic view showing the structure of another embodiment of the invention.

FIG. 9 shows a field emission device that is another embodiment of the invention that has been developed further. Specifically, the number of control electrodes has been increased to an arbitrary N−1 electrodes (altogether N electrodes, when extractor electrode $G_1$ is included). A user is able to apply desired control potentials $Vc_1$ to $Vc_{N-1}$ to the control electrodes $G_2$ to $G_N$ of the N−1 electrodes in accordance with the control mode under which it is desired to use these field emission devices. The foregoing explanations apply to other structural parts and considerations, there being no particular limitations on the arrangement of this embodiment.

In the foregoing the invention has been described with reference to a number of embodiments of the invention. However, the arrangements can be freely modified so long as such modifications do not depart from the gist of the invention. In terms of the principle of the invention, the three-dimensional shape of the emitter 13 is not limited to the illustrated conical shape, but may be a pyramidal or columnar.

What is claimed is:

1. A field emission device comprising:

an n-type source region having an attached source electrode formed on a surface of a p-type semiconductor substrate, a p-type emitter rising from a surface of the p-type semiconductor substrate with which the p-type emitter is in direct contact, the p-type emitter being laterally separated from the n-type source region and having an apex portion, and an extraction and control electrode formed by an electrode layer provided on an insulating layer formed on the p-type semiconductor substrate and having an aperture facing the apex portion of the p-type emitter, said electrode layer extending from the aperture to above the n-type source region for extracting cold electrons from the p-type emitter and for applying a voltage for selectively inducing an inversion layer on a surface of the p-type semiconductor substrate between the n-type source region and the p-type emitter and on the p-type emitter surface.

2. A field emission device according to claim 1, wherein:

the p-type emitter is formed from the p-type semiconductor substrate.

3. A field emission device comprising:

an n-type source region having an attached source electrode formed on a surface of a p-type semiconductor substrate, a metal emitter rising from a surface of the p-type semiconductor substrate with which the metal emitter is in direct contact, the metal emitter being laterally separated from the n-type source region and having an apex portion, and an extraction and control electrode formed by an electrode layer provided on an insulating layer formed on the p-type semiconductor substrate and having an aperture facing the apex portion of the metal emitter, said electrode layer extending from the aperture to above the n-type source region for extracting cold electrons from the metal emitter and for applying a voltage for selectively inducing an inversion layer on a surface of the p-type semiconductor substrate between the n-type source region and the metal emitter.

4. A field emission device according to claim 1, wherein:

the surface of the p-type emitter is covered with a protective layer that is chemically inert.

5. A field emission device comprising:

an n-type source region having an attached source electrode formed on a surface of a p-type semiconductor substrate, an emitter rising from a surface of the p-type semiconductor substrate, the emitter being laterally separated from the n-type source region and having an apex portion, an insulating layer provided on the p-type semiconductor substrate between the emitter and the source region, an extractor electrode for applying a voltage for extracting cold electrons from the emitter apex portion, the extractor electrode being provided on the insulating layer and having an aperture facing the apex portion of the emitter, and a plurality of control electrodes for selectively applying a voltage for inducing an inversion layer at a surface of the p-type semiconductor substrate below the insulating layer, said control electrodes being provided in a mutually transversely parallel arrangement on the insulating layer between an edge of the extractor electrode on the source region side and an edge of the source region on the emitter side.

6. A field emission device according to claim 5, wherein:

the number of control electrodes is two, of which one is connected to an X selection line and another is connected to a Y selection line.

7. A field emission device according to claim 5, wherein:

the number of control electrodes is three, of which one is connected to an X selection line, another is connected to a Y selection line, and another is connected to a control line for controlling a field emission current flow via the emitter.

8. A field emission device according to claim 5, wherein:

the p-type semiconductor substrate has a substrate potential source for applying a prescribed substrate potential to the p-type semiconductor substrate.

9. A field emission device according to claim 5, wherein:

the emitter is an n-type emitter formed by introduction of n-type impurity after the emitter has been formed from the p-type semiconductor substrate.

10. A field emission device according to claim 5, wherein:

the emitter is formed over an n-type drain region provided on the surface of the p-type substrate.

11. A field emission device according to claim 5, wherein:

the emitter is an n-type emitter formed on the p-type semiconductor substrate separately from the p-type semiconductor substrate.

12. A field emission device according to claim 5, wherein:

the emitter is a metal emitter formed on the p-type semiconductor substrate separately from the p-type semiconductor substrate.

13. A field emission device according to claim 5, wherein:

the emitter is a p-type emitter obtained by processing the p-type semiconductor substrate itself.

14. A field emission device according to claim 5, wherein:

the surface of the emitter is covered with a protective layer that is chemically inert.

* * * * *